US012665554B2

(12) United States Patent
Wang et al.

(10) Patent No.: US 12,665,554 B2
(45) Date of Patent: Jun. 23, 2026

(54) RADIO FREQUENCY POWER AMPLIFIER MODULE

(71) Applicant: KOREA INSTITUTE OF FUSION ENERGY, Daejeon (KR)

(72) Inventors: Son Jong Wang, Daejeon (KR); Hyun Ho Wi, Daejeon (KR)

(73) Assignee: Korea Institute of Fusion Energy, Daejeon (KR)

( * ) Notice: Subject to any disclaimer, the term of this patent is extended or adjusted under 35 U.S.C. 154(b) by 565 days.

(21) Appl. No.: 18/305,282

(22) Filed: Apr. 21, 2023

(65) Prior Publication Data

US 2024/0048106 A1 Feb. 8, 2024

(30) Foreign Application Priority Data

Aug. 2, 2022 (KR) ........................ 10-2022-0096366

(51) Int. Cl.
*H03F 3/24* (2006.01)
*H03F 3/60* (2006.01)

(52) U.S. Cl.
CPC ............. *H03F 3/245* (2013.01); *H03F 3/602* (2013.01); *H03F 2200/114* (2013.01); *H03F 2200/451* (2013.01)

(58) Field of Classification Search
CPC .... H03F 3/245; H03F 3/602; H03F 2200/114; H03F 2200/451

USPC ........................................................ 375/231
See application file for complete search history.

(56) References Cited

U.S. PATENT DOCUMENTS

| | | | |
|---|---|---|---|
| 6,806,791 B1 | 10/2004 | Wang et al. | |
| 9,509,034 B2 | 11/2016 | Xue et al. | |
| 2018/0279499 A1 * | 9/2018 | Abs .......................... | H05K 7/18 |

FOREIGN PATENT DOCUMENTS

WO     WO-2014120047 A1 * 8/2014 ................ H01P 5/04

OTHER PUBLICATIONS

De La Morena et al., "Single-step port-reconfigurable cavity combiner with high efficiency", Nuclear Inst. and Methods in Physics Research Section A: Accelerators, Spectrometers, Detectors and Associated Equipment, vol. 972, Aug. 2020, 164108, https://doi.org/10.1016/j.nima.2020.164108.

* cited by examiner

*Primary Examiner* — Kevin M Burd
(74) *Attorney, Agent, or Firm* — Knobbe, Martens, Olson & Bear, LLP

(57) ABSTRACT

Disclosed is a radio frequency power amplifier module. The radio frequency power amplifier module according to an embodiment of the disclosed technology includes a module main body one or more amplifier semiconductors installed inside the module main body, and a coupler electrically connected to the amplifier semiconductor and protruding and extending to the outside of the module main body to transmit electromagnetic waves.

10 Claims, 3 Drawing Sheets

RADIO FREQUENCY POWER AMPLIFIER MODULE

CROSS REFERENCE TO RELATED APPLICATION

The application claims priority to Korean Patent Application No. 10-2022-0096366, filed Aug. 2, 2022, the entire content of which is incorporated herein for all purposes by this reference.

BACKGROUND

Field

The disclosed technology relates generally to a radio frequency power amplifier module and, more particularly, to a radio frequency power amplifier module capable of combining to a radio frequency power combiner for outputting the combined power.

Description of the Related Art

In nuclear fusion research, accelerator, and the military defense field, the high-power radio frequency of 10 kW to 2 MW for energy transfer through the acceleration of charged particles in a plasma state is necessary.

In such fields, an electron tube has been mainly used, which easily oscillates or amplifies with high power and efficiency. However, due to the durability problem of the electron tube, the use of semiconductor amplifiers has recently increased as the efficiency of semiconductor amplifiers has increased.

Despite having several advantages, such as a long lifespan, and no need for high-voltage devices, semiconductor amplifiers have a limitation in power per unit module. Accordingly, although there has been an effort to continuously develop and acquire high power by combining a plurality of combiners such as the Wilkinson combiner, Gysel combiner, and waveguide combiner, which outputs low power, the existing combiners have problems in that the number of combinable input ports is limited and have a high loss.

In other words, when the combiners are combined in a multi-stage to overcome the limitation of the number of combinable input ports, the existing combiners for the semiconductor amplifiers have a problem in that the final combining loss rapidly increases if the loss coefficient, which generates at each individual combining stage, is applied.

For example, a waveguide cavity combiner (Waveguide Cavity combiner: Single-step port reconfigurable cavity combiner with high efficiency, Nuclear Inst. and Methods in Physics Research, A 972 (2020) 164108) that can significantly increase the number of input ports in the high frequency more than 100 MHz has been developed and commercialized in the combiner capable of outputting several 100 kW with high efficiency.

However, such waveguide cavity combiner requires 10-2000 semiconductor amplifiers with only output of 0.5-2 kW per unit amplifier and requires developing a method of installing such a large number of amplifiers reasonably, effectively, and at a low cost.

SUMMARY

To address at least a portion of the above-described deficiencies, one or more aspects of the disclosed technology correspond to a radio frequency power amplifier module that can be easy to (e.g., facilitate to) assembled and/or installed with a radio frequency power combiner that can also easy to (e.g., facilitated to) remove and maintain by providing a module type to a semiconductor amplifier combiner.

The technical aspects of the disclosed technology are not limited to the above-described technical aspects and other technical aspects which are not described herein will become apparent to those skilled in the art from the following description.

According to one or more aspects of the disclosed technology, a radio frequency power amplifier module includes: a module main body; one or more amplifier semiconductors installed inside the module main body; and a coupler configured to electrically connect to at least one of the one or more amplifier semiconductors, and the coupler protrude and extend outside of the module main body to transmit electromagnetic waves at a radio frequency, wherein the module main body has provided on a front side thereof an assembly slot such that the coupler extends from an inside to an outside of the module main body, and a flange that protrudes and extends in an outward direction from the module main body.

In some embodiments of the disclosed technology, the module main body may include an installation box disposed inside the amplifier module; and a cover plate configured to cover one surface of the installation box and to provide the assembly slot to form the flange.

In some embodiments of the disclosed technology, the cover plate may include an extension plate that is wider than one surface of the installation box and extends outside of the installation box; and a front plate coupled to the extension plate and having a reduced size while having generally a same shape as the extension plate, wherein the front plate is configured to protrude thereby forming a step on the extension plate.

In some embodiments of the disclosed technology, the coupler may include an outer coupler exposed to the front part of the cover plate in the assembly slot; and an inner coupler connected to the amplifier semiconductor connected to the outer coupler.

In some embodiments of the disclosed technology, a first end portion of the outer coupler is electrically connected to the inner coupler and has a loop shape in which a second end portion is coupled to the cover plate.

In some embodiments of the disclosed technology, the outer coupler may be provided in a "U" or "⊐" shape.

In some embodiments of the disclosed technology, the module includes a plurality of couplers disposed at upper and lower parts of the cover plate.

In some embodiments of the disclosed technology, the amplifier semiconductor may be provided in plural corresponding to the coupler.

In some embodiments of the disclosed technology, each amplifier semiconductor is provided as a semiconductor package for outputting electromagnetic waves.

In some embodiments of the disclosed technology, the module main body may be shielded to protect the amplifier semiconductor from external electromagnetic waves.

DETAILED DESCRIPTION

Figure 1:
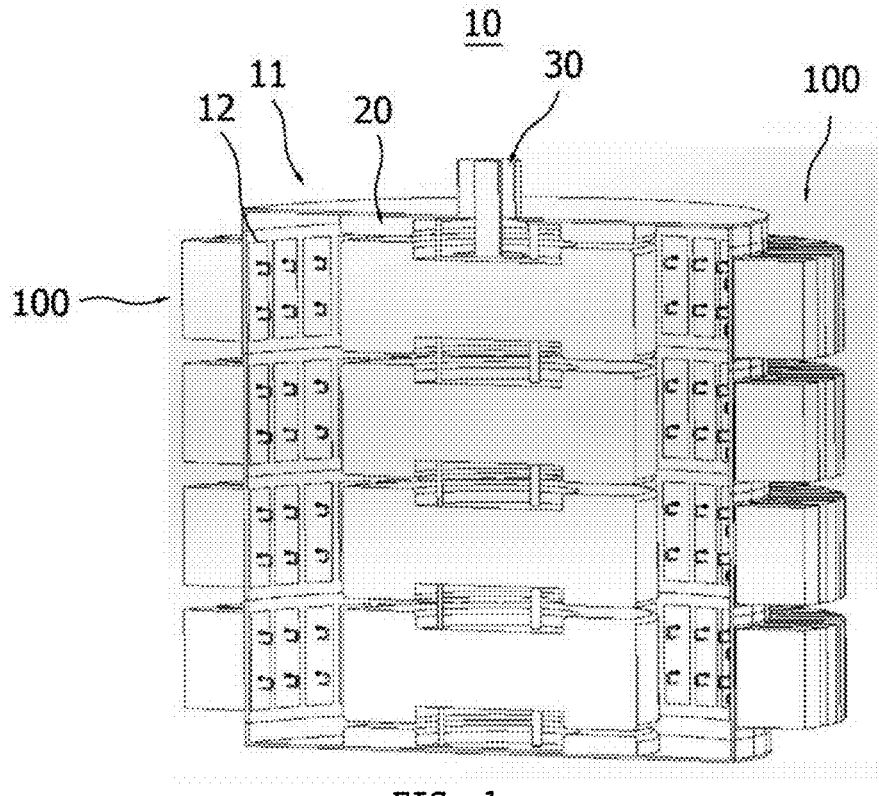
FIG. 1 illustrates a three-dimensional front cross-sectional view in which a radio frequency power amplifier module is installed in a radio frequency power amplifier combiner.

The disclosed technology will be described hereinafter with reference to the accompanying drawings. However, the disclosed technology may be modified in various different ways, and the disclosed technology is not limited to the described exemplary embodiments. Moreover, the part not related to the description will be omitted in order to clearly describe the disclosed technology. Like reference numerals designate like elements throughout the specification.

In the specification, when a part is connected (accessed, contacted, or coupled) with other parts, it includes "direct connection" as well as "indirect connection" in which the other member is positioned between the parts. In addition, unless explicitly described to the contrary, the word "comprise", such as "comprises" or "comprising" will be understood to imply the inclusion of stated elements but not the exclusion of any other elements.

The terms used in this specification are merely used to describe particular embodiments, and are not intended to limit the disclosed technology. Expression in the singular number include a plural form unless the context clearly indicates otherwise. In this specification, the term "comprise" or "have" is intended to designate characteristic, numbers, steps, operations, elements, components, or combinations thereof, but it is not intended to preclude the presence or addition of one or more other features, numbers, steps, operations, elements, components, or combinations.

Aspects of disclosed technology may provide a radio frequency power amplifier module that is easy to install and assemble by providing a module type to a combiner of a semiconductor amplifier, and is easy to attach and detach, allowing an easy maintenance.

The aspect of the disclosed technology is not limited to the aspects disclosed herein, and it should be understood to include all possible aspects deduced from the configuration of the invention, as disclosed or claimed herein.

Hereinafter, exemplary embodiments of the disclosed technology will be described in detail with reference to the accompanying drawings.

Figure 2:
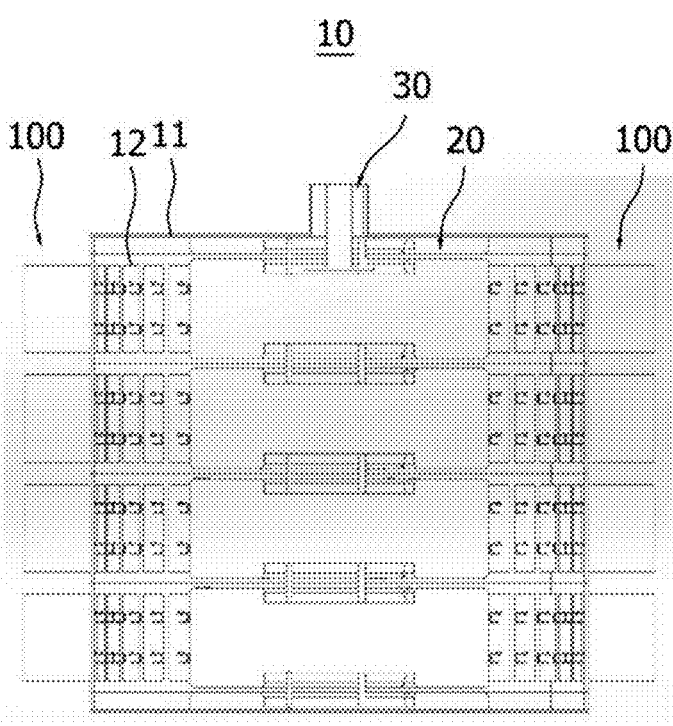
FIG. 2 illustrates a front cross-sectional view of FIG. 1.
Figure 3:
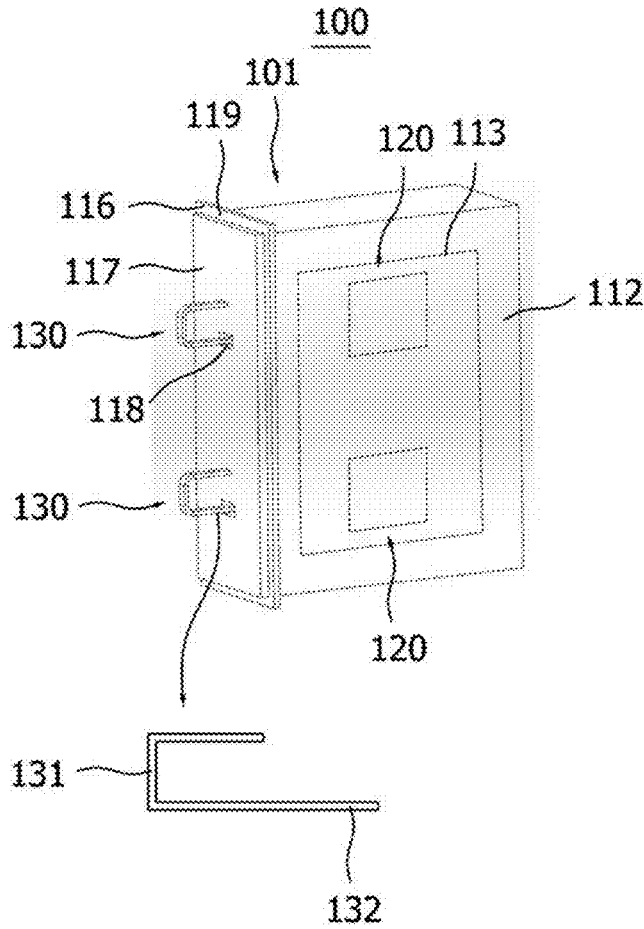
FIG. 3 illustrates a three-dimensional view of a radio frequency power amplifier module in FIG. 1.

FIG. 1 illustrates a three-dimensional front cross-sectional view in which a radio frequency power amplifier module is installed in a radio frequency power amplifier combiner, FIG. 2 illustrates a front cross-sectional view of FIG. 1, and FIG. 3 illustrates a three-dimensional view of a radio frequency power amplifier module in FIG. 1.

Referring to FIGS. 1 to 3, a radio frequency power amplifier module 100, according to an embodiment of disclosed technology, can be inserted and installed in a placement slot 12 of a combiner 10 with a cavity formed, in which the radio frequency power amplifier module 100 can be collectively installed to output high power radio frequency, and can be disposed in the circumferential direction of a coupler main body 11 and can be provided in a module structure that may be stacked at intervals in the height direction.

The radio frequency power amplifier module 100 according to some embodiments of the disclosed technology can include a module main body 101, one or more amplifier semiconductors 120 installed inside the module main body 101, and a coupler 130 electrically connected to the amplifier semiconductor 120 and protruding and extending to the outside of the module main body to transmit electromagnetic waves. The electromagnetic waves can also be referred to as "electromagnetic," "electromagnetic radiation," "microwave radiation," "wireless radiation," "microwave," "frequency wave," "radio waves," etc. For the purpose of description, the disclosed technology used the term "electromagnetic waves."

The module main body 101 can have a rectangular parallelepiped shape, and may be made of metal, non-metal, and synthetic composite material capable of electrically and thermally shielding the inside, and a plate 113, which can fix the amplifier semiconductor 120, can be provided inside.

The module main body 101 may include an installation box 112 in which a plate 113 is disposed inside the amplifier semiconductor 120, an assembly slot 118 covering one side of the installation box 112, and a cover plate 115 forming a flange 119.

The module main body 101 can be installed by inserting the installation box 112 into the placement slot 12 of the combiner main body 11, and the flange 119 of the cover plate 115 may be disposed on the wall part configuring the placement 12. The flange 119 may be coupled to the combiner main body 11 by various fastening means, such as a rivet, a screw, a bolt, and a bracket for fastening may be further used.

The cover plate 115 can include an extension plate 116 extending outward of the installation box 112, forming wider than one surface of the installation box 112, and a front plate 117 can include a front plate 117 coupled to the extension plate 116 and provide in a reduced shape compared to the extension plate 116. The front plate 117 may be protruded to form a step in an extension plate 116.

In the front surface of the module main body 101, the assembly slot 118 can be provided so that the coupler 130 extends from the inside to the outside of the module main body 101, and the flange 119 extending outward from the module main body 101 and protruding is provided.

The assembly slot 118 can provide a structure in which the coupler 130 is easily inserted, corresponding to the cross-sectional structure of the coupler 130, and the flange 119 may be provided in a rectangular rim shape.

Meanwhile, the coupler 130 may include an outer coupler 131 exposed to the front part of the cover plate 115 in the assembly slot 118, and an inner coupler 132 connected to the amplifier semiconductor 120 connected to the outer coupler 131.

The outer coupler 131 may be provided in a loop shape with one side open to serve as an antenna capable of transmitting electromagnetic waves of the amplifier semiconductor 120 to the outside but is not limited thereto, and the outer coupler 131 may be opened or connected thereto.

In some embodiments, the first end portion of the outer coupler 131 can be electrically connected to the inner coupler 132, and the second end portion is coupled to the cover plate 115. Here, the outer coupler 131 and the inner coupler 132 are suggested as an integrally connected structures but are not limited thereto, and the structure thereof may also be an electrically connected through the assembly slot 118.

That is, one side of the loop-shaped outer coupler 131 can be connected to an output terminal of the amplifier semiconductor 120 through the inner coupler 132, and the other side can be connected to the front plate 117 so as to electrically connect to the outer conductor of the cavity of the radio frequency power combiner.

In some embodiments, the outer coupler 131 be provided in a "U" or "⊏" shape that can output the electromagnetic wave, but is not limited thereto, and any structure capable of transmitting electromagnetic waves toward the central axis of the combiner main body 11 can be utilized.

The coupler 130 can be provided as singular or plural, and in the case of provided plural, the coupler 130 may be provided on the upper and lower parts of the cover plate 115. The outer coupler 131 of the coupler 130 is disposed in the same refracted shape.

The amplifier semiconductor 120 may be provided as a semiconductor package for outputting electromagnetic waves and may be provided as plural, corresponding to the coupler 130.

The amplifier semiconductor 120 can be an integrated circuit for outputting high output electromagnetic waves and connected to the output terminal for the connection of the inner coupler 132. For example, the inner coupler 132 of the coupler 130 may be connected as a socket structure in the output terminal provided on the plate 113.

In some embodiments, the amplifier semiconductor 120 may be mounted on the plate 113, which is provided for stably supplying the power.

In some embodiments, the module main body 101 may be shielded to protect the amplifier semiconductor 120 from the external electromagnetic waves. For example, the shielding of the module main body 101 may be provided with a shielding coating, in which the amplifier semiconductor 120 is protected from the high-power electromagnetic waves generated in the coupler 130.

The radio frequency power amplifier module 100, according to one or more embodiments of the disclosed technology can be mounted and used to surround the combiner main body 11, so that the installation module is used to output the radio frequency electromagnetic waves to the outside through capacitive or inductive output couplers 30 installed in the coupler body 11 through the cylinder-shaped inner conductor 20 receiving electromagnetic waves inside the combiner 10.

The radio frequency power amplifier module 100 can have a structure that can be easily mounted when inserted and fixed in the combiner main body 11, and since the coupler 130 is used as the input coupler 130 of the output coupler 30 of the combiner main body 11 is integrally connected, there is advantage in that, as in the related art, installing couplers 130 on the combiner main body 11 and connecting cables of the electromagnetic wave supply device that supplies electromagnetic waves is eliminated.

More specifically, in a general cavity combiner, the combining position accuracy of each individual combiner module attached to the side of the coupler may significantly affect the combining performance of the entire combiner, and if there is an n number of combiner modules for amplifying the radio frequency power, the phase and magnitude of electromagnetic waves generated from each combiner module, that is, applied into the entire combiner (cavity-shaped radio frequency power combiner), all n couplers have to be the same, and there is no combining loss due to the phase of electromagnetic waves and the amplitude imbalance.

The radio frequency power module 100, as disclosed herein, can be provided as a radio frequency power amplifier module, and a combiner module that is combined to the entire combiner, which is configured to combine by designing separately to the entire combiner and provides the following technical advantages.

1. As individual performance verification of the radio frequency power amplifier module 100 is possible, it is possible to check defects of the individual radio frequency power amplifier module 100 in advance.

2. As performance comparison and calibration between the radio frequency power amplifier module 100 is possible, technical problems such as phase and amplitude imbalance of electromagnetic waves may be solved.

3. In the event of a failure of the radio frequency power amplifier module 100, in terms of maintenance, it is an integral type that is easy to separate and maintain, and easy to reinstall due to replacement, and the overall repair is easy.

4. In the event of inaccurate combining position (phase imbalance and amplitude imbalance) due to machining tolerances and assembly tolerances for the entire combiner of the radio frequency power amplifier module 100, calibration can be performed, and it is possible to accomplish the high combining efficiency.

Meanwhile, the radio frequency power amplifier module 100 suggested in the present embodiment is expressed to be used in combination with a coaxial cavity shaped combiner, but the scope of the disclosed technology is not limited thereto. It should be noted that the coaxial cavity combiner is merely a structure suggested as an example and can also be applied to combiners of other non-coaxial structures.

The above-described description of the disclosed technology is for illustrative purposes. It would be apparent to one skilled in the art may understand that it is possible to easily modified in other specific forms without departing from the technical spirit and essential features of the disclosed technology. Thus, above-described embodiments should be understood that they have been presented by way of example and not limitation. For example, each component described as one-piece embodiment may be distributed. The component described as the degree of dispersion may be carried out in a combined form.

The scope of the disclosed technology is represented by the following claims, and it should be construed that all changes or variations derived from the meaning and scope of the claims and the equivalent concept thereof are included within the scope of the disclosed technology.

What is claimed is:

1. A radio frequency (RF) power amplifier module comprising:

a module main body;

one or more amplifier semiconductors installed inside the module main body; and a coupler electrically connected to at least one of the one or more amplifier semiconductors, and protrude and extend outside of the module main body to transmit electromagnetic waves at a radio frequency, wherein the coupler is arranged to have a partial loop configuration and comprises:

a first end and a second end both extending towards the module main body, the first end terminating outside the main body and serving as an antenna to transmit the electromagnetic waves, and the second end extending farther towards the module main body than the first end to terminate inside the main body and connected to an outer terminal of the one or more amplifier semiconductors for receiving amplified signal therefrom, and wherein the module main body has provided on a front side thereof an assembly slot such that the coupler extends from an inside to an outside of the module main body, and a flange that protrudes and extends in an outward direction from the module main body.

2. The module of claim 1, wherein the module main body further comprises:

an installation box disposed inside the RF power amplifier module; and a cover plate configured to cover one surface of the installation box and to provide the assembly slot to form the flange.

3. The module of claim 2, wherein the cover plate further comprises:

an extension plate that is wider than one surface of the installation box and extends outside of the installation box; and a front plate coupled to the extension plate and having a reduced size while having generally a same shape as the extension plate, wherein the front plate is configured to protrude thereby forming a step on the extension plate.

4. The module of claim 2, wherein the coupler further comprises:

an outer coupler portion exposed to a front part of the cover plate in the assembly slot; and an inner coupler portion, having the second end, connected to the amplifier semiconductor.

5. The module of claim 4, wherein the outer coupler portion is continuous with the inner coupler, and wherein the outer coupler portion has the first end coupled to the cover plate.

6. The module of claim 5, wherein the outer coupler has a "U" or "⊏" shape.

7. The module of claim 4, wherein the module comprises a plurality of couplers disposed at upper and lower parts of the cover plate.

8. The module of claim 7, wherein the module comprises a plurality of amplifier semiconductors each corresponding to one of the couplers.

9. The module of claim 1, wherein each amplifier semiconductor is provided as a semiconductor package for outputting electromagnetic waves.

10. The module of claim 9, wherein the module main body is shielded to protect the amplifier semiconductor from external electromagnetic waves.

* * * * *